United States Patent [19]
Frechet et al.

[11] Patent Number: 6,013,413
[45] Date of Patent: Jan. 11, 2000

[54] ALICYCLIC NORTRICYCLENE POLYMERS AND CO-POLYMERS

[75] Inventors: Jean M. J. Frechet, Oakland; Quingshan Niu, El Cerrito, both of Calif.

[73] Assignee: Cornell Research Foundation, Inc., Ithaca, N.Y.

[21] Appl. No.: 09/030,461

[22] Filed: Feb. 25, 1998

Related U.S. Application Data

[60] Provisional application No. 60/039,206, Feb. 28, 1997.
[51] Int. Cl.$^7$ .................................. G03C 1/73; C07F 32/06
[52] U.S. Cl. ........................ 430/270.1; 526/281; 526/282
[58] Field of Search ................................. 430/270.1, 280.1, 430/287.1; 526/273, 279, 282, 280, 271, 281

[56] References Cited

U.S. PATENT DOCUMENTS 4,613,456  9/1986  Matsuno et al. ........................ 568/821

*Primary Examiner*—Mark F. Huff
*Assistant Examiner*—Sin J. Lee
*Attorney, Agent, or Firm*—Bruce F. Jacobs

[57] ABSTRACT

Alicyclic nortricyclene polymers and co-polymers suitable for deep ultraviolet microlithography applications.

17 Claims, No Drawings

ALICYCLIC NORTRICYCLENE POLYMERS AND CO-POLYMERS

This application claims the benefit of U.S. Provisional Application 60/039,206, filed on Feb. 28, 1997.

GOVERNMENT RIGHTS

The United States government has certain rights in this invention based upon a grant from the Office of Naval Research (A58-8467).

FIELD OF THE INVENTION

This invention is related to monomers, polymers, copolymers and compositions useful in deep ultraviolet microlithography.

BACKGROUND OF THE INVENTION

As the microelectronics industry evolves, the use of smaller microelectronic structures such as semiconductors and memory chips becomes increasingly important. Reduced circuit element size not only allows more transistors to be packed into a smaller volume but also reduces manufacturing costs.

Photolithographic processes used in microelectronics manufacturing define the size of all circuit elements. To make a semiconductor device, for instance, a silicon wafer is coated with a film of a photosensitive material and exposed through a stencil called a "mask." Radiation exposure alters the film's chemical structure in regions exposed to light. This chemical change produces differences in the dissolution rate in appropriate solvents. Selective dissolution of either the exposed or the unexposed areas of the film produces positive or negative tone images, respectively. The process produces a three-dimensional relief image in the thin polymeric film that faithfully replicates the opaque and transparent areas of the mask. This polymeric relief image is subsequently transferred to the underlying substrate by a sequence of etching, deposition or implantation steps to ultimately produce the active device. Suitable photosensitive materials must be sufficiently strong to resist the etching steps.

An important, yet unrealized, goal of the microelectronics industry has been to develop microlithography processes which operate at a wavelength of 193 nm. Microlithography processes operating at 193 nm would allow image features well below 0.25 microns to be printed. Until now, photosensitive materials such as Novolac or poly(hydroxystyrene)—the current standard materials have been useful only at wavelengths above 300 nm and above 240 nm, respectively, and cannot be used at 193 nm due to the presence of aromatic (benzene) rings. Early development of 193 nm resists was based on polymers such at poly(t-butyl methacrylate) or poly(adamantyl methacrylate) or other acrylic polymers that are optically clear at 193 nm. However, these polymers have not been sufficiently durable to withstand the harsh plasma etch steps required to transfer the resist pattern onto underlying substrates.

U.S. Pat. No. 4,491,628 discloses resist compositions made from styrene polymers in combination with a photoinitiator that releases an acid-catalyst that facilitates the chemical changes in the photosensitive material, thereby reducing the amount of ultraviolet light needed to alter the film's chemical structure. These resist materials cannot form images at 193 nm.

Norbornene polymers have been suggested for resist applications. For example, J. V. Crivello and S. Y. Shim (Chemistry of Materials, 8, 376–381 (1996)) have described electron beam resists based on polymers and copolymers of 2-t-butoxycarbonyl nobornene and 2,3-di-t-butoxycarbonyl norbornene with 4-t-butoxy-alpha-methyl styrene. The polymers are described as not possessing good oxygen plasma etch resistance. The polymers, prepared by free-radical polymerization, do not undergo cyclopolymerization. Also, the polymers are ill-defined and have linkages at the 7-position of the initial norbornene monomer as well as one of the carbon atoms that initially belonged to the carbon-carbon double bond.

Similarly, Goodall et al (PCT Application. WO 95/14048) has obtained structurally ill-controlled functionalized poly(norbornene) with both 2,3 and 2,7 linkages with a process that involves metal ion catalyzed polymerization. The metal ion catalyzed polymerization involves metal catalysts that leave metal residues in the polymer after preparation that would be detrimental to resist performance.

T. I. Wallow et al (SPIE Proceedings, 1996, 2724, 355–364) have repeated the use of a copolymer of unfunctionalized norbornene and maleic anhydride for 193 nm photolithography. Unfortunately, the copolymer has poor development characteristics. A structurally ill-defined terpolymer with 15 to 17.5% acrylic acid displays better properties, but the acrylic acid moieties decrease the etch resistance of the terpolymer even further and do not contribute to the terpolymer's imaging characteristics.

Although polymers with nortricyclene structures have been known, their preparation has often been cumbersome and resulted in ill-defined irregular structures with several different repeat units in the polymer chains. No regular uncrosslinked nortricyclene polymers have been prepared. Graham et al, J. Org. Chem., 1961, 26, 4558, describes the free radical polymerization of 2-carbethoxy-bicyclo[2.2.1]-2-5-heptadiene to afford a product that has an irregular structure with more than one repeating nortricyclene type unit as well as some 1,2-polymerized norbornene type units. Graham emphasizes its inability to achieve high conversion without gelation of the polymer as a result of 1,2-directed polymerization, thus leading to the formation of its unsaturated, crosslinked, irregular polymers. Graham contains no suggestion that regular uncrosslinked poly(nortricyclene) polymers or copolymers can be made. Graham does not utilize any bulky ester or other similar groups which have been found essential for the formation of the regular nortricyclene structures of the present invention. Also, none of the prior art nortricyclene polymers and copolymers have ever been used in any practical application, i.e. as photoresists.

Accordingly, there has been a long felt need for 193 nm microlithographic techniques that utilize imaging materials that are transparent to ultraviolet radiation at 193 nm and have good etch resistance. The present invention meets this need.

It is an object of this invention to produce regular alicyclic nortricyclene polymers and copolymers from an alicyclic norbornadiene monomer.

It is a further object to develop a resist composition from a soluble alicyclic nortricyclene polymer or copolymer.

It is a further object to overcome the polymerization difficulties of the prior art by designing a variety of bulky 2-alkoxycarbonyl norbornadiene monomers and then achieving high conversions during polymerization thereof while also avoiding contamination by metal ions.

These and still further objects will be apparent from the following description of this invention.

SUMMARY OF THE INVENTION

The present invention is directed to nortricyclene polymers made from a norbornadiene monomer containing a bulky side group at the 2-position. As used herein, the term "bulky" refers to any group which is sufficiently large so as to cause the monomer to undergo cyclopolymerization, instead of 1,2-vinyl polymerization, throughout the entire polymerization.

The nortricyclene polymers are made from norbornadiene monomers having Formula I:

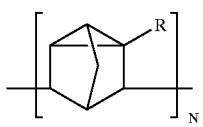

wherein R is a bulky group. The resulting polymers are regular and are substantially uncrosslinked and contain substantially no unsaturation. Generally the R groups are photo, thermal, and/or acid cleavable groups.

The nortricyclene polymers may be made from norbornadiene monomer esters having Formula II:

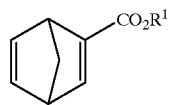

wherein —$CO_2R^1$ is the bulky group R. Preferably, the —$CO_2R^1$ groups are photo, thermal, and/or acid cleavable groups.

The nortricyclene polymers may also be made from norbornadiene monomer amides having Formula III:

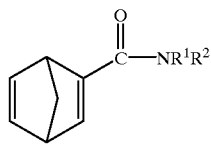

wherein —$NR^1R^2$ is the bulky group R. The group may be a symmetrical or a non-symmetrical amide group. Preferably, the —$NR^1R^2$ groups are photo, thermal, and/or acid cleavable groups.

More preferably, $R^1$ is selected from the group consisting of secondary alkyl groups having from about 3 to about 8 carbon atoms; tertiary alkyl groups having from about 4 to about 10 carbon atoms; allylic 1-alkyl-2-alkenyl groups having 4 to 10 carbon atoms; 1-alkoxyalkyl groups —CH($OR^3$)$R^4$ in which $R^3$ is an alkyl group having from 1 to 6 carbon atoms and $R^4$ is an alkyl group having 1 to about 6 carbon atoms, or $R^3$ is —$(CH_2$—$CH_2O)_n$—$R^5$ wherein "n" is an integer from 1 to about 10 and $R^5$ is an alkyl group with 1 to about 6 carbon atoms; a tetrahydropyranyl (THP) group; a trialkyl silyl group having a total of from 3 to about 15 carbon atoms; dimethylphenylsilyl; methyldiphenylsilyl; triphenylsilyl; secondary benzylic groups having from 8 to about 14 carbon atoms; and tertiary benzylic groups having from 9 to about 14 carbon atoms; a cycloalkenyl group; an epoxy alkyl group; 2-cyclohexenyl; an alkylether of poly(ethyleneglycol); methyltriethyleneglycol; a butyltriethyleneglycol group; methylpoly(ethyleneglycol) 2000; an alkylsilyl group; trimethylsilyl; an alkoxysilyl group, an alicyclic cage group; an adamantyl group, norbornyl; an alicyclic fused group; t-butyllithocholyl). $R^2$ is selected from the same groups as $R^1$ and hydrogen. $R^2$ is the same as $R^1$ or different.

The present invention is also directed to nortricyclene copolymers of two or more of the norbornadiene monomers, copolymers of a norbornadiene monomer with other comonomers, photoresists containing the polymer or co-polymers, and the use of the photoresists at deep ultra-violet wavelengths, especially below 200 nm.

DESCRIPTION OF PREFERRED EMBODIMENTS

The norbornadiene monomers generally have Formula I:

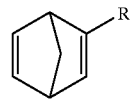

wherein R is a bulky side group.

Preferably, the nortricyclene polymers are made from norbornadiene carboxylate esters having Formula II:

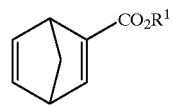

wherein $CO_2R^1$ is the bulky side group R.

The nortricyclene polymers may also be made from norbornadiene monomer amides having Formula III:

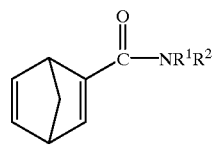

wherein —$NR^1R^2$ is the bulky group R. The group may be a symmetrical or a non-symmetrical amide group. Preferably, the —$NR^1R^2$ groups are photo, thermal, and/or acid cleavable groups.

More preferably, $R^1$ is selected from the group consisting of secondary alkyl groups having from about 3 to about 8 carbon atoms; tertiary alkyl groups having from about 4 to about 10 carbon atoms; allylic 1-alkyl-2-alkenyl groups having 4 to 10 carbon atoms; 1-alkoxyalkyl groups —CH($OR^3$)$R^4$ in which $R^3$ is an alkyl group having from 1 to 6 carbon atoms and $R^4$ is an alkyl group having 1 to about 6 carbon atoms, or $R^3$ is —$(CH_2$—$CH_2O)_n$—$R^5$ wherein "n" is an integer from 1 to about 10 and $R^5$ is an alkyl group with 1 to about 6 carbon atoms; a tetrahydropyranyl (THP) group; a trialkyl silyl group having a total of from 3 to about 15 carbon atoms; dimethylphenylsilyl; methyldiphenylsilyl; triphenylsilyl; secondary benzylic groups having from 8 to about 14 carbon atoms; and tertiary benzylic groups having from 9 to about 14 carbon atoms; a cycloalkenyl group; epoxy alkyl; 2-cyclohexenyl; an alkylether of poly(ethyleneglycol) ; methyltriethyleneglycol; a butyltriethyleneglycol group; methylpoly(ethyleneglycol) 2000; an alkylsilyl group; an alkoxysilyl group; an alicyclic cage group; an adamantyl group; a norbornyl group; an alicyclic fused group; a t-Butyllithocholyl group).

$R^2$ is selected from the same groups as $R^1$ and hydrogen. $R^2$ may be the same as $R^1$ or different.

Even more preferably, $R^1$ is t-butyl, trimethylsilyl, t-butyldimethylsilyl, or tetrahydropyranyl.

The norbornadiene ester monomers may be prepared in a Diels-Alder reaction in which an alkene and a diene undergo cycloaddition. For instance, cyclopentadiene may be reacted with a propiolic acid derivative in a Diels-Alder reaction to yield the alicyclic monomers substituted at the appropriate 2 position. The norbornadiene monomers may also be prepared by transesterification of the reaction product of cyclopentadiene and a propiolic acid ester. The norbornadiene monomers may also be prepared by modifying the adduct of propiolic acid and cyclopentadiene by reacting the adduct with isobutylene, a vinyl ether or dihydropyran. Another method for making the norbornadiene monomers may involve the direct metalation of norbornadiene followed by reaction with an electrophile such as chloroformate.

The norbornadiene amide monomers may be prepared by any suitable means. For instance, they can be made by reacting a suitable amount of 2-norbornadienecarboxylic acid and an amine, e.g., aziridine, in conditions that produce the norbornadiene amide monomers. To make 2-norbornadienecarboxylic acid aziridyl amide, a reaction mixture can be made by combining suitable amounts of N-N'-methanetetraylbiscyclohexanamine (DCC) and aziridine to a solution of 2-norbornadienecarboxylic acid in dichlormethane at room temperature.

The presence of the bulky group at the 2 position of the norbornadiene monomers prevents crosslinking during the polymerization of the monomers and enables the production of the nortricyclene polymers which are regular, uncrosslinked, and soluble. The bulky groups provide sufficient steric interactions to inhibit intermolecular additions in favor of intramolecular cyclization in these diene systems. As a consequence, monomers possessing a bulky group at the 2 position undergo cyclopolymerization instead of and the substantial absence of 1,2-vinyl addition. Thus the polymers of this invention are regular, i.e. contain a single repeat unit, and soluble, including when prepared in yields higher than 60%. When the bulky groups are esters of the formula $CO_2R^1$ or amides $CONR^1R^2$ the polymers are particularly useful in imaging chemistry and have the aqueous base solubility needed for development in classical aqueous base resist developers.

The alicyclic nortricyclene polymers of this invention are uncrosslinked linear polymers made by polymerizing the bulky norbornadiene monomers under free radical polymerization conditions. The polymer is generally of the Formula IV:

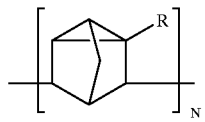

wherein R is as previously defined and n is a number from about 10 to about 10,000.

The nortricyclene polymers are generally transparent at the wavelength of deep ultraviolet light, i.e. below 250 nm, preferably below 200 nm, and more preferably at 193 nm. The nortricyclene polymers are also sufficiently rigid to withstand the harsh plasma etch steps required to transfer a resist pattern onto an underlying substrate when the polymers are used in resist compositions. Also, the multiple alicyclic ring structure of the nortricyclene polymers enables the nortricyclene polymers to have an etch resistance that is at least about 70%, more preferably at least about 75%, and even more preferably at least about 85% of the etch resistance of Novolac polymers. Since the glass transition temperature of the nortricyclene polymers is generally above 200° C., the polymers do not flow under normal resist processing and baking conditions.

To increase the relative transparency of the polymer, the three membered ring of the polymer can be reduced by catalytic hydrogenation. This may be done by any suitable means. For example, the reduction can take place with 5% Pd on $CH_2$ at 1 atmosphere at room temperature with the polymer in solution in toluene. The relative transparency can be measured with ultraviolet spectroscopy of spin-cast polymer films on quartz.

The alicyclic nortricyclene polymers of the present invention are soluble in most common organic solvents such as tetrahydrofuran, toluene, xylene, benzene, acetone, chloroform, methylene chloride, cyclohexane, t-butyl alcohol, and propylene glycol methyl ether acetate (PGMEA). Other structurally or functionally equivalent solvents are within the scope of this invention.

The average molecular weight of the nortricyclene polymers when used for photoresist applications is generally at least about 2,000 daltons, more preferably at least about 5,000 daltons as measured by gel permeation chromatography with polystyrene standards. Suitable molecular weights may be from about 2,000 to about 2,000,000, more preferably from about 3,500 to about 50,000 daltons. Other molecular weights are within the scope of this invention.

The nortricyclene polymers may be polymerized by using standard free-radical polymerization techniques. For instance, the polymers may be made by (i) forming a polymerization reaction mixture by dissolving the norbornadiene monomer in an organic solvent, (ii) adding a free radical generating polymerization initiator and (iii) polymerizing the monomers into a nortricyclene polymer.

Suitable free radical generating initiators are well known in the art of polymerization chemistry. Preferably an azo initiator such as 2,2'-azobis(isobutyonitrile) (AIBN) is used. Other suitable initiators include radical photoinitiators (benzophenone, benzil, benzoin and benzoin derivatives); living free radical initiators such as (TEMPO) derivatives or halides and copper salts. Other well known free radical generating initiators, including thermal and light, may be used.

The organic solvent is any organic solvent which will dissolve the norbornadiene monomer. Suitable such organic solvents are commonly selected from benzene, toluene, t-butanol, xylene, tetrahydrofuran, and cyclohexane, as well as other structurally or functionally equivalent organic solvents.

Suitable reaction temperatures generally range from about room temperature to about 100° C., preferably from about 50 to about 100° C., more preferably from about 50 to about 80° C., and more preferably from about 60 to about 70° C. The monomers can undergo a thermal polymerization at temperatures greater than 100° C. Higher and lower temperatures may also be suitable.

Suitable polymerization times will generally be many hours, commonly from about 5 to about 48 hours, and preferably from about 10 to about 30 hours.

Nortricyclene copolymers generally have a Formula V:

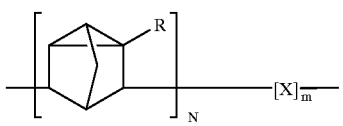

wherein R is as defined above, n is number from about 10 to about 1,000, X is derived from a comonomer selected from the group consisting of the monomers of Formula I and maleic anhydride derivatives of Formula VI:

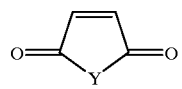

wherein Y is selected from the group consisting of O, N—H, N—OH, N—$CO_2C(CH_3)_3$, and $NOCO_2C(CH_3)_3$, and m is a number from about 10 to about 1,000. Other structurally or functionally similar Y groups are within the scope of this invention.

To modify the properties of the nortricyclene polymers (e.g. the rigidity, adhesion, and imaging properties of the polymers) one or more various functional co-monomers may be added to the polymerization reaction mixture prior to the addition of the free radical initiator. Such functional co-monomers may be present in amounts of at least 1%, more preferably at least 10%, and even more preferably at least 20% of the weight of the primary monomer. Suitable amounts may range from about 1 to about 80%, more preferably from about 10 to about 70% of the weight of the primary monomer. Other amounts within the ranges expressly disclosed above may also be suitable.

When the comonomer of the nortricyclene polymers is maleic anhydride, an alternating copolymer having equal molar amounts of the two monomers may be obtained. The use of smaller amounts, i.e. less than 50 mole %, of maleic anhydride in the copolymerization reaction is also possible. The incorporation of maleic anhydride in the copolymer produces a polymer film having improved adhesion to silicon wafers. It also improves the wetting of the film by standard alkaline aqueous developer solutions.

The copolymers are also soluble in common organic solvents such as tetrafuran, chloroform, and propylene glycol methyl ether acetate (PGMEA).

Nortricyclene polymer photoresist compositions may be made by combining a nortricyclene polymer or co-polymer as described above with a photoacid initiator (generator). The "photoacid initiator" includes any substance which produces a strong acid upon exposure to radiation. Suitable photoacid generators may be selected from the group consisting of sulfonium or iodonium salts, halogenated aromatic compounds, o-nitrobenzyl sulfonates, tri-(methanesulfonyloxy)benzene, andarylnaphthoquinonediazide-4-sulfonates, triphenylsulfonium hexafluoroantimonate, triphenylsulfonium triflate, triphenylsulfonium hexafluorophosphate, triphenylsulfonium hexafluoroarsenate, diphenyliodonium hexafluoroantimonate, diphenyliodonium triflate, diphenyliodonium hexafluorophosphate, diphenyliodonium hexafluoroarsenate, beta-oxo-cyclohexylmethyl(2-norbornyl) sulfonium triflate, N-hydroxysuccinimide tosylate. Triarylselonium salts and substituted aryldiazonium salts may also be useful. Other photoacid initiators disclosed in U.S. Pat. No. 4,491,628 and Reichman et al., Chem. Mater., 1991, 3, 394–407, incorporated herein by reference, may also be suitable.

The nortricyclene polymer resist compositions may contain other materials known in the art of photoresist chemistry. For instance, the composition may contain a dissolution inhibitor in a 3-component composition. The dissolution inhibitor may function as a plasticizer and may contribute to the adhesion of the resists onto silicon wafers (or other substrates). The dissolution inhibitor may be selected from the group consisting of bis-t-butyoxycarbonyloxy bisphenol A, t-butyloxynaphthalene, t-butylnaphthoate, t-butylnaphthylether, tert-butylcholate, t-butyldeoxycholate, t-butyllithocholate, t-butyoxycarbonyloxy bisphenol A, 4,4'-bis-t-butyloxycarbonyloxy diphenylsulfone, bis-(4-t-butyloxycarbonyloxyphenyl) phenylsulfoniumhexafluoroantimonate, (4-methylphenyl)methanediol dipropionate, (4-methylphenyl)methanediol dibenzoate, phenyl methanediol bis(phenylacetate), phenylmethanediol-bis(diphenylacetate), (4-acetyloxyphenyl)methanediol, bis(diphenyl-acetate), phenyl methanediol bis(2,4,6-trimethylbenzoate, (4-methoxyphenyl)methanediol bis(diphenylacetate), (4-ethoxyphenyl) methanediol bis(diphenylacetate), and (4-hydroxyphenyl)methanediol bis(diphenylacetate) t-butyldeoycholate, t-butylcholate, bis (t-butyllithocholate). Other structurally or functionally similar dissolution inhibitors may be used.

The nortricyclene polymer resist compositions form an image on a substrate of a microelectronic structure by (a) forming a resist film on a microelectronic substrate and (b) irradiating predetermined sites of the resist film to activate the photoacid initiator at the predetermined sites to create an image on the substrate.

The nortricyclene polymer resist composition may be used on any substrate useful in preparing microelectronic products. For example, the microelectronic substrate may include substrates made from silicon, glass, quartz and ceramics. Other structurally or functionally similar substrates may be used.

The nortricyclene polymer resist may be used to make microelectronic structures by (a) forming a resist on a microelectronic substrate and (b) irradiating predetermined sites of the resist with deep UV radiation to activate the photoacid initiator at the predetermined sites (and to create exposed and unexposed sites of the resist) (c) heating the resist; and (d) removing matter from the exposed sites to provide a microelectronic structure. The resist will ordinarily be heated to at least about 50° C., more preferably to at least about 80° C., and even more preferably to at least about 100° C. Generally the heating will be to a maximum temperature of less than 200° C., preferably less than 175° C., and most preferably to less than 150° C.

The following illustrative non-limiting examples further describe the invention. All parts and percents are by weight unless otherwise stated. Molecular weights were determined by gel permeation chromatography calibrated with polystyrene standards.

EXAMPLE 1

To make the monomer 2-t-butoxycarbonyl norbornadiene, freshly distilled cyclopentadiene (4.0 g, 0.061 mole) was added to 5.0 g (0.04 mole) of t-butyl propiolate in 5.0 g of benzene. The reaction mixture was heated to 60° C. for 24 hours in a sealed tube, then cooled to room temperature. After removal of the solvent, the resulting mixture was separated by column chromatography to afford the product as a colorless oil (5.56 g, 72%).

EXAMPLE 2

To make the monomer 2-trimethylsilyloxycarbonyl norbornadiene, freshly distilled cyclopentadiene (4.2 g. 0.0064 mole) was added to a solution containing (7.5 g, 0.052 mole) trimethylsilyl propiolate and 7.5 g benzene. The solution was heated at 60° C. for 24 hours in a sealed tube. After cooling, the reaction mixture was distilled under vacuum to afford 7.2 g (67%) of product, which was moisture sensitive.

EXAMPLE 3

To make the monomer 2-isopropoxycarbonyl (norbornadiene), cyclopentadiene (1.45 ml, 0.018 mole) and a trace of hydroquinone was added to a solution of isopropyl propiolate (1.307 g, 0.0012 mole) in toluene (1.5 ml). The reaction mixture was heated to 90° C. for 22 hours. After cooling to room temperature, the reaction mixture was subjected to chromatography to afford 2-isopropoxycarbonyl norbornadiene (1.4554 g, 70%).

EXAMPLE 4

To polymerize the monomer 2-t-butoxycarbonyl norbornadiene of Example 1, 2.0 g (0.010 mole) of freshly purified 2-t-butoxycarbonyl norbornadiene was mixed with 2.0 g benzene. After purging with nitrogen for 10 minutes, 2,2'-azobis(isobutyronitrile) (AIBN) (33 mg, 0.0002 mole) was added to the solution and the resulting mixture was heated at 65° C. under nitrogen for 20 hours. After cooling, the solution was diluted with 5 ml tetrahydrofuran (THF) and added to methanol (ca. 500 ml). The precipitated polymer was collected by filtration and washed thoroughly with methanol, and then dried under vacuum for 24 hours to afford a finely divided white polymer (1.42 g, 71%). The molecular weight of the polymer was 59,100 daltons.

EXAMPLE 5

To polymerize the monomer 2-trimethylsilyloxycarbonyl norbornadiene of Example 2, 2.08 g, (0.01 mole) of the 2-trimethylsilyloxycarbonyl norbornadiene was mixed with 2.08 g benzene After purging with nitrogen for 10 minutes, AIBN (33 mg, 0.0002 mole) was added to the solution and the resulting mixture was heated at 65° C. under nitrogen for 20 hours. After cooling, the solution was diluted with 5 ml THF and precipitated into acetonitrile (ca. 500 ml). The precipitate was filtered and washed thoroughly with acetonitrile. It was then dried under vacuum for 24 hours to afford a finely divided white polymer. The molecular weight of the polymer was 40,800 daltons.

EXAMPLE 6

To polymerize the monomer 2-isopropoxycarbonyl norbornadiene of Example 3, AIBN (23.7 mg, 0.000143 mole) was added to 2-isopropoxycarbonyl norbornadiene (1.2778 g, 0.0078 mole) in benzene (1.33 ml). The reaction mixture was purged with nitrogen gas and heated to 65° C. for 20 hours. The reaction mixture was then cooled to room temperature and the polymer was precipitated and washed with methanol, then vacuum dried to yield a white solid (1.0197g, 80%). The molecular weight of the polymer was 53,700 daltons.

EXAMPLE 7

To co-polymerize two norbornadiene monomers, freshly purified 2-t-butoxycarbonyl norbornadiene (1.92 g, 0.01 mole) and 2-trimethylsilyloxycarbonyl norbornadiene (0.52 g, 0.0025 mole) were mixed with 2.45 g benzene. After purging with nitrogen for 10 minutes, 41 mg of AIBN (0.00025 mole) was added to the solution. The resulting mixture was heated at 65° C. under nitrogen for 20 hours. After cooling, the solution was diluted with 5 ml THF and precipitated into methanol (ca. 500 ml). The precipitated polymer was collected by filtration and washed with methanol. It was then dried under vacuum for 24 hours to give 1.66 g (73%) powdery white co-polymer which was freed of monomer and trimethylsilyl (TMS) protecting group. TG/DTA analysis show that this co-polymer contained about 20 mol % of free acid pendant groups and had a molecular weight of 52,600 daltons.

EXAMPLE 8

To co-polymerize two norbornadiene monomers, freshly purified 2-t-butoxycarbonyl norbornadiene (3.84 g, 0.02 mole) and 2-trimethylsilyloxycarbonyl norbornadiene (6.24 g, 0.03 mole) were mixed with 10.0 g benzene. After purging with nitrogen for 10 minutes, 164 mg of AIBN (0.001 mole) was added to the solution and the resulting mixture was heated at 65° C. under nitrogen for 20 hours. After cooling, the solution was diluted with 15 ml THF and precipitated into methanol (ca. 500 ml). The precipitated polymer was collected by filtration and washed with methanol sufficiently. It was then dried under vacuum for 24 hours to give 5.92 g (76%) finely divided white co-polymer which was freed of monomer and TMS protecting group. TG/DTA analysis show that this co-polymer contain about 60 mol % of free acid pendent groups. The copolymer had a molecular weight of 62,200 daltons.

EXAMPLE 9

The procedure of Example 8 was repeated with freshly purified 2-t-butoxycarbonyl norbornadiene (7.68 g, 0.040 mole) and 2-trimethylsilyloxycarbonyl norbornadiene (2.08 g, 0.01 mole) were mixed with 9.76 g benzene. After purging with nitrogen for 10 minutes, 164 mg of AIBN (0.001 mole) was added to the solution and the resulting mixture was heated at 65° C. under nitrogen for 20 hours. After cooling, the solution was diluted with 15 ml THF and precipitated into acetonitrile (ca. 500 ml). The precipitated polymer was collected by filtration and washed with acetonitrile. It was then dried under vacuum for 24 hours to give 7.91 g (81%) powdery white co-polymer. The copolymer had a molecular weight of 68,400 daltons.

EXAMPLE 10

Freshly purified 2-t-butoxycarbonyl norbornadiene (3.84 g, 0.020 mole) and maleic anhydride (1.96 g, 0.020 mole) were mixed with 5.80 g benzene. After purging with nitrogen for 10 minutes, 131 mg of AIBN (0.0008 mole) was added to the solution and the resulting mixture was heated at 65° C. under nitrogen for 20 hours. After cooling, the solution was diluted with 10 ml THF and added to methanol (ca. 500 ml). The precipitated polymer was collected by filtration and washed with methanol. It was then dried under vacuum for 24 hours to give 4.88 g (84%) powdery white co-polymer which was freed of monomer. TG/DTA analysis showed that this co-polymer contained about 50 mol % maleic anhydride groups. The copolymer had a molecular weight of 24,300 daltons.

EXAMPLE 11

Freshly purified 2-t-butoxycarbonyl norbornadiene (1.92 g, 0.010 mole) and t-butoxycarbonyl maleimide (1.97 g, 0.010 mole) were mixed with 3.89 g benzene. After purging with nitrogen for 10 minutes, 66 mg of AIBN (0.0004 mole) was added to the solution and the resulting mixture was heated at 65° C. under nitrogen for 20 hours. After cooling, the solution was diluted with 10 ml THF and added to hexanes (ca. 500 ml). The precipitated polymer was collected by filtration and washed with hexanes. It was then dried under vacuum for 24 hours to give 3.39 g (87%) powdery white co-polymer which was freed of monomer. TG/DTA analysis showed that this co-polymer contained about 50 mol % N-t-butoxycarbonylmaleimide groups. The copolymer had a molecular weight of 54,300 daltons.

EXAMPLE 12

Freshly purified 2-t-butoxycarbonyl norbornadiene (1.92 g, 0.010 mole) and maleimide (0.97 g, 0.010 mole) were mixed with 2.89 g t-butyl alcohol. After purging with nitrogen for 10 minutes, 66 mg of AIBN (0.0004 mole) was added to the solution and the resulting mixture was heated at 65° C. under nitrogen for 20 hours. After cooling, the solution was diluted with 10 ml THF and added to methanol (ca. 500 ml). The precipitated polymer was collected by filtration and washed with methanol. It was then dried under vacuum for 24 hours to give 2.4 g (83%) powdery white co-polymer which was freed of monomer.

EXAMPLE 13

To form an image on a substrate with a nortricyclene polymer resist, 20 parts by weight t-butyl deoxycholate (BDC), 75 parts of the copolymer from Example 7 and 5 parts triphenyl sulfonium hexafluoroantimonate (a photoacid generator) were dissolved in propylene glycol methyl ether acetate (PGMEA) (15% solids) and filtered through a 0.45 $\mu$m filter, then spin coated at 3000 RPM onto a silicon wafer and prebaked at 140° C. for 1 minute to afford a 0.75 micron film. After the film was exposed with a 193 nm excimer laser stepper, it was postbaked at 140° C. for 1 minute, then developed with 50% 0.26 N tetramethylammonium hydroxide aqueous developer solution. An image with feature size below 0.25 $\mu$m was obtained.

EXAMPLE 14

To form an image on a substrate with a nortricyclene polymer resist, 20 parts % t-butyl deoxycholate, 75 parts maleic anhydride co-polymer of Example 10, and 5 parts of triphenylsulfonium hexafluroantimonate (a photoacid generator) were dissolved in PGMEA (15% solids) and filtered through a 0.45 $\mu$m filter. Spin coating at 2500 RPM and prebaking at 140° C. for 1 minute afforded a 0.6 micron film. After the film was exposed with 193 nm excimer laser stepper, postbaked at 140° C. for 1 minute, and developed with 10% of 0.21 N TMAH aqueous solution. Images with a feature size of 0.14 $\mu$m were obtained.

EXAMPLE 15

To form an image on a substrate with a nortricyclene polymer resist, 20 parts t-butyl deoxycholate, 75 parts co-polymer from Example 11 and 5 parts triphenylsulfonium hexafluoroantimonate were dissolved in PGMEA (15% solids) and filtered through a 0.45 $\mu$m filter. Spin coating at 2500 RPM and prebaking at 140° C. for 1 minute afforded a 0.60 micron film. After the film was exposed with 193 nm excimer laser stepper, postbaked at 140° C. for 1 minute, and developed with 10% of 0.21 N TMAH aqueous developer solution. Images with a feature size of below 0.2$\mu$ were obtained.

EXAMPLE 16

To form an image on a substrate with a nortricyclene polymer resist, 20 parts t-butyl deoxycholate, 75 parts 20% trimethylsilyloxycarbonylnorbornadiene/2-t-butoxycarbonylnorbornadiene co-polymer and 5 parts triphenylsulfonium hexafluoroantimonate were dissolved in PGMEA (15% solids) and filtered through a 0.45 $\mu$m filter. Spin coating at 3000 RPM and prebaking at 140° C. for 1 minute afforded a 0.75 micron film. After the film was exposed with a 193 nm excimer laser stepper, postbaked at 140° C. for 1 minute, and developed with 10% of 0.21 N TMAH aqueous developer solution. Images with feature size of less than 0.25 $\mu$m were obtained.

EXAMPLE 17

To form an image on a substrate with a polymer nortricyclene polymer resist, 20 parts t-butyl deoxycholate, 75 parts 2-t-butoxycarbonyl norbornadiene homopolymer, and 5 parts triphenylsulfonium hexafluoroantimonate were dissolved in PGMEA (15% solids) and filtered through a 0.45 $\mu$m filter. Spin coating at 3000 RPM and pre-baking at 140° C. for 1 minute afforded a 0.75 micron film. After the film was exposed with 193 nm excimer laser stepper, it was postbaked at 140° C. for 1 minute and developed with 10% of 0.21 N TMAH aqueous developer solution. Images with a feature size of 0.2 $\mu$m were obtained.

EXAMPLE 18

To form an image on a substrate with a nortricyclene polymer resist, 30 parts t-butyl deoxycholate, 65 parts of the copolymer of Example 8, and 5 parts triphenylsulfonium hexafluoroantimonate were dissolved in PGMEA (15% solids) and filtered through a 0.45 $\mu$m filter, then spin coated at 3000 RPM and prebaking at 140° C. for 1 minute to afford a 0.75 micron film. After the film was exposed with 193 nm excimer laser stepper, postbaked at 140° C. for 1 minute, and developed with 10% of 0.21 N TMAH aqueous developer solution. Images with a feature size of 0.2 $\mu$m were obtained.

EXAMPLE 19

To form an image on a substrate with a nortricyclene polymer resist, 20 parts t-butyl deoxycholate, 75 parts of the copolymer of Example 8 and 5 parts of triphenylsulfonium hexafluoroantimonate were dissolved in PGMEA (15% solids) and filtered through a 0.45 $\mu$m filter, then spin coated at 3000 RPM and prebaked at 140° C. for 1 minute to afford a 0.75 micron film. After the film was exposed with 193 nm excimer laser stepper, postbaked at 140° C. for 1 minute, and developed with 10% of 0.21 N TMAH aqueous developer solution. Images with a feature size of below 0.2 $\mu$m were obtained.

EXAMPLE 20

To form an image on substrate with a nortricyclene polymer resist, 20 parts t-butyl deoxycholate, 75 parts maleimide co-polymer from Example 12, and 5 parts triphenylsulfonium hexafluoroantimonate were dissolved in diglyme (15% solids) and filtered through a 0.45 $\mu$m filter, then spin coated at 2500 RPM and prebaking at 140° C. for 1 minute to afforded a 0.60 micron film. After the film was exposed with 193 nm excimer laser stepper, postbaked at 140° C. for 1 minute, and developed with 10% of 0.21 N TMAH aqueous developer solution, Images with feature sizes of 0.18 $\mu$m were obtained.

EXAMPLE 21

To make the monomer t-Butyl-2-norbornadienecarboxylate, a solution of t-butylpropynoate (17.46 g, 139 mmol), cyclopentadiene (3.03 g, 45.9 mmol, 0.33 eq) and hydroquinone (20 mg) was heated in a sealed tube (65 degrees) for 2 h. Additional cyclopentadiene was added over 14.5 h (16.77 g, 254.3 mmol, 1.83 eq) in six equal portions with heating between each addition for 2 h at 65 degrees. The crude monomer was purified by flash chromatography (500 g silica gel eluted with a gradient of EtOAc in Hexane) to give the product as thick water white oil (19.6683 g, 74%). Boiling point (0.5 mm HG) 105 degrees. The freezing point was −5 degrees.

EXAMPLE 22

The monomer methyltriethyleneglycolyl-2-norbornadienecarboxylate was made. First, methyltriethyleneglycolyl propynoate was prepared as follows. A solution of dicyclocarbodiimide (DCC) (5.00 g, 24.4 mmol, 1.2 eq) and DMAP (0.250 g, 10 mol %) in dichloromethane (5 ml) was added dropwise for 10 min to a solution of propynoic acid (1.40 g, 20.3 mmol), triethyleneglycolmonomethylether (4.00 g, 24.4 mmol, 1.2 eq) and dichloromethane (20 ml, 1M) that was chilled to −78° C. The resulting solution was allowed to reach room temperature over 12 h. The reaction mixture was concentrated in vacuo and purified by flash chromatography to give the product as a thick water white oil (3.422 g, 79%).

Then, a solution of methyltriethyleneglycolyl propynoate (3.422 g, 15.9 mmol), hexane (3 ml) and hydroquinone (10 mg) was heated in a sealed tube (65° C.). Cyclopentadiene (1.53 g, 23.2 mmol, 1.47 eq) was added and the reaction mixture was heated for 2.5 hours. At this time a second portion of cyclopentadiene (0.91 g, 13.8 mmol, 0.87 eq) was added and the heating resumed for 2.5 h. Finally, a third portion of cyclopentadiene (0.94 g, 14.2 mmol, 0.90 eq) was added and the heating resumed for 2.5 hours. In this portionwise manner, an excess of cyclopentadiene was added over 7.5 hours (3.38 g, 51.2 mmol, 3.24 eq). The crude monomer was purified by flash to give the product as thick water white oil (3.15 g, 71%).

EXAMPLE 23

In this example, the monomer n-Butyltriethyleneglycolyl-2-norbornadienecarboxylate was made. n-Butyltriethyleneglycolyl propynoate was made as follows. A solution of dicyclocarbodiimide (DCC) (4.00 g, 19.35 mmol, 1.2 eq) and DMAP (0.240 g, 10 mol %) in dichloromethane (5 ml) was added dropwise for 10 minutes to a solution of propynoic acid (1.17 g, 16.69 mmol), triethyleneglycolmonon-butylylether (3.99 g, 19.4 mmol, 1.2 eq) and dichloromethane (20 ml, 1M) that was chilled to −78° C. The resulting solution was allowed to come up to room temperature over 12 hours. The reaction mixture was concentrated in vacuo and purified by flash chromatography to give the product as a thick water white oil (3.472 g, 85%).

Then, in a solution of n-butyltriethyleneglycolyl propynoate (2.577 g, 10.0 mmol), and hydroquinone (3 mg) was heated in a sealed tube (67 degrees). Cyclopentadiene (0.5 ml) was added and the reaction mixture was heated for 3 h. At this time a second portion of cyclopentadiene (1 ml) was added and the heating resumed for 10 h. Finally, a third portion of cyclopentadiene (1 ml) was added and the heating resumed for 3.5 h. In this portionwise manner, an excess of cyclopentadiene was added over 16.5 h (2.5 ml). The crude monomer was purified by flash to give the product as thick water white oil (2.997 g, 93%).

EXAMPLE 24

In this example a terpolymer was prepared. A solution of maleic anhydride (0.196 g, 2 mmol) n-Butyltriethyleneglycolyl-2-norbornadienecarboxylate (0.323 g, 1 mmol) and t-Butyl-2-norbornadienecarboxylate (0.1891 g, 1 mmol) in benzene (0.8 ml, 5 M) was treated with AIBN (12.0 mg, 0.0731 mmol, 2 mol %), degassed and heated to 67 degrees for 20 h. The resulting thick polymer solution was dissolved in THF (2 ml) and precipitated from hexane (50 ml) then the precipitate was dissolved in THF (2 ml) and precipitated again from MeOH to give the terpolymer as fine white solids (0.318 g, 45%).

EXAMPLE 25

To make 2-norbornadienecarboxylic acid aziridyl amide, the following was procedure was performed. Dicyclocarbodiimide (DCC) (1.40 g, 6.8 mmol) and aziridine (0.25 g, 5.8 mmol) was added to a solution of 2-norbornadienecarboxylic acid (1.36 g, 10 mmol) in dichlormethane (10 ml, 1M) at room temperature. The reaction mixture was allowed to stir for 1 h at room temperature, then was concentrated in vacuo and purified by flash chromatography to give the product as a thick water white oil (0.50 g, 56%).

What is claimed is:

1. A regular uncrosslinked nortricyclene polymer of the general formula

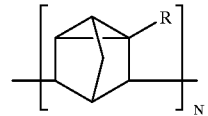

wherein R is a bulky group sufficiently large so as to have caused the polymer to undergo cyclopolymerization, instead of 1,2-vinyl polymerization, throughout the polymerization; and wherein n is the degree of polymerization.

2. The nortricyclene polymer of claim 1, wherein R is selected from —$CO_2R^1$ and —$NR^1R^2$ groups, $R^1$ is a group selected from the group consisting of photo, thermal, and acid cleavable groups, and $R^2$ is hydrogen or $R^1$.

3. The nortricyclene polymer of claim 1, wherein $R^1$ is selected from the group consisting of secondary alkyl groups having from about 3 to about 8 carbon atoms; tertiary alkyl groups having from about 4 to about 10 carbon atoms; allylic 1-alkyl-2-alkenyl groups having 4 to 10 carbon atoms; 1-alkoxyalkyl groups —$CH(OR^3)R^4$ in which $R^3$ is an alkyl group having from 1 to 6 carbon atoms and $R^4$ is an alkyl group having 1 to about 6 carbon atoms, or $R^3$ is —$(CH_2-CH_2O)_n$—$R^5$ wherein "n" is an integer from 1 to about 10 and $R^5$ is an alkyl group with 1 to about 6 carbon atoms; a tetrahydropyranyl (THP) group; a trialkyl silyl group having a total of from 3 to about 15 carbon atoms; dimethylphenylsilyl; methyldiphenylsilyl; triphenylsilyl; secondary benzylic groups having from 8 to about 14 carbon atoms; and tertiary benzylic groups having from 9 to about 14 carbon atoms; t-butyl, trimethylsilyl, t-butyldimethylsilyl, a cycloalkenyl group; epoxy alkyl 2-cyclohexenyl; an alkylether of poly(ethyleneglycol); methyltriethyleneglycol; a butyltriethyleneglycol group; methylpoly(ethyleneglycol) 2000; an alkylsilyl group; an alkoxysilyl group, an alicyclic cage group; an adamantyl group, norbornyl; an alicyclic fused group; t-butyllithocholyl.

4. The nortricyclene polymer of claim 1, wherein the polymer is transparent at about 193 nm.

5. The nortricyclene polymer of claim 1, wherein the polymer is soluble in a solvent selected from the group consisting of tetrahydrofuran, toluene, xylene, benzene, acetone, chloroform, methylene chloride, cyclohexane, t-butyl alcohol, and propylene glycol methyl ether acetate.

6. The nortricyclene polymer of claim 1, further including a co-monomer.

7. The nortricyclene polymer of claim 1, wherein the polymer has an etch resistance that is at least about 70% the etch resistance of Novolac polymers.

8. A photoresist composition comprising a photoacid initiator and a regular, uncrosslinked nortricyclene polymer having the formula:

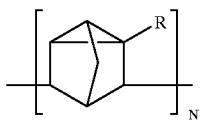

wherein R is a bulky group sufficiently large so as to have caused the polymer to undergo cyclopolymerization, instead of 1,2-vinyl polymerization, throughout the polymerization; and wherein n is the degree of polymerization.

9. The photoresist composition of claim 8, wherein R is selected from —$CO_2R^1$ and —$NR^1R^2$ groups, $R^1$ is a group selected from the group consisting of photo, thermal, and acid cleavable groups, and $R^2$ is hydrogen or $R^1$.

10. The photoresist composition of claim 9, wherein $R^1$ is selected from the group consisting of secondary alkyl groups having from about 3 to about 8 carbon atoms; tertiary alkyl groups having from about 4 to about 10 carbon atoms; allylic 1-alkyl-2-alkenyl groups having 4 to 10 carbon atoms; 1-alkoxyalkyl groups —$CH(OR^3)R^4$ in which $R^3$ is an alkyl group having from 1 to 6 carbon atoms and $R^4$ is an alkyl group having 1 to about 6 carbon atoms, or $R^3$ is —($CH_2$—$CH_2O)_n$—$R^5$ wherein n is an integer from 1 to about 10 and $R^5$ is an alkyl group with 1 to about 6 carbon atoms; a tetrahydropyranyl group; a trialkyl silyl group having a total of from 3 to about 15 carbon atoms; dimethylphenylsilyl; methyldiphenylsilyl; triphenylsilyl; a secondary benzylic group having from 8 to about 14 carbon atoms; and a tertiary benzylic group having from 9 to about 14 carbon atoms; t-butyl, trimethylsilyl; t-butyldimethylsilyl; a cycloalkenyl group; epoxy alkyl; 2-cyclohexenyl; an alkylether of poly (ethyleneglycol); methyltriethyleneglycol; a butyltriethyleneglycol group; methylpoly(ethyleneglycol) 2000; an alkylsilyl group; an alkoxysilyl group, an alicyclic cage group; an adamantyl group, norbornyl; an alicyclic fused group; t-butyllithocholyl.

11. The photoresist composition of claim 8 further containing a dissolution inhibitor.

12. The photoresist composition of claim 8 coated on a substrate.

13. The photoresist composition of claim 12, wherein the substrate is selected from the group consisting of silicon, glass, quarts and ceramics.

14. The photoresist composition of claim 8, wherein the resist is transparent at about 193 nm.

15. The photoresist composition of claim 8, wherein the resist has an etch resistance that is at least about 70% the etch resistance of Novolac polymers.

16. The photoresist composition of claim 8 after exposure to ultraviolet radiation.

17. The photoresist composition of claim 16, wherein the ultraviolet radiation is at a wavelength of less than 200 nm.

* * * * *

UNITED STATES PATENT AND TRADEMARK OFFICE
CERTIFICATE OF CORRECTION

PATENT NO. : 6,013,413

DATED : Jan. 11, 2000

INVENTORS : Frechet et al.

It is certified that errors appear in the above-identified patent and that said Letters Patent is hereby corrected as shown below:

In the Claims:

Claim 3, line 1: Delete "claim 1" and insert --claim 2--.

Signed and Sealed this

Twenty-fourth Day of October, 2000

Attest:

Q. TODD DICKINSON

Attesting Officer

Director of Patents and Trademarks